(12) United States Patent
Chou

(10) Patent No.: US 9,229,059 B2
(45) Date of Patent: Jan. 5, 2016

(54) MEMORY TEST SYSTEM AND METHOD

(71) Applicant: ELITE SEMICONDUCTOR MEMORY TECHNOLOGY INC., Hsinchu (TW)

(72) Inventor: Min-Chung Chou, Hsinchu (TW)

(73) Assignee: ELITE SEMICONDUCTOR MEMORY TECHNOLOGY INC., Hsinchu (TW)

(*) Notice: Subject to any disclaimer, the term of this patent is extended or adjusted under 35 U.S.C. 154(b) by 55 days.

(21) Appl. No.: 14/099,318

(22) Filed: Dec. 6, 2013

(65) Prior Publication Data

US 2015/0162096 A1    Jun. 11, 2015

(51) Int. Cl.

| | | |
|---|---|---|
| G01R 31/319 | (2006.01) | |
| G11C 29/48 | (2006.01) | |
| G11C 29/26 | (2006.01) | |
| G11C 29/00 | (2006.01) | |
| G11C 29/56 | (2006.01) | |
| G11C 29/12 | (2006.01) | |
| G11C 29/40 | (2006.01) | |
| G11C 29/10 | (2006.01) | |
| G11C 29/36 | (2006.01) | |

(52) U.S. Cl.
CPC .......... *G01R 31/31912* (2013.01); *G11C 29/00* (2013.01); *G11C 29/10* (2013.01); *G11C 29/1201* (2013.01); *G11C 29/26* (2013.01); *G11C 29/36* (2013.01); *G11C 29/40* (2013.01); *G11C 29/48* (2013.01); *G11C 2029/5602* (2013.01)

(58) Field of Classification Search
CPC .. G01R 31/31912; G11C 29/48; G11C 29/26; G11C 29/00; G11C 2029/5602
See application file for complete search history.

(56) References Cited

U.S. PATENT DOCUMENTS

| | | | |
|---|---|---|---|
| 6,671,836 B1* | 12/2003 | Lai et al. | 714/718 |
| 6,823,485 B1* | 11/2004 | Muranaka | 714/719 |
| 6,907,555 B1* | 6/2005 | Nomura et al. | 714/719 |
| 2002/0105352 A1* | 8/2002 | Mori et al. | 324/765 |
| 2006/0276989 A1* | 12/2006 | Ludwig et al. | 702/122 |
| 2012/0072790 A1* | 3/2012 | Burggraf et al. | 714/718 |

* cited by examiner

*Primary Examiner* — Joseph D Torres
(74) *Attorney, Agent, or Firm* — Li & Cai Intellectual Property (USA) Office

(57) ABSTRACT

An exemplary embodiment of the present disclosure illustrates a memory test system comprising a memory device, a probe card, and a tester. The memory device comprises a memory die with a plurality of memory banks, a plurality of input circuits, and a plurality of output circuits, wherein each of the input circuits has a first input pin and a second pin, the first input pins of the input circuits are used to read a plurality of patches of data stored in memory cells of the memory banks, and the second input pins are used to receive a compressed result. The output circuits receive compressed signals output from the input circuits, and the probe card mixes the compressed output signals output from the output circuits to output a mixed compressed output signal to the tester.

5 Claims, 3 Drawing Sheets

US 9,229,059 B2

MEMORY TEST SYSTEM AND METHOD

BACKGROUND

1. Technical Field

The present disclosure is related to a memory device, and in particular to, a memory test system and method for testing the memory device.

2. Description of Related Art

Currently, the memory device technology develops fast, and the memory devices with large capacities are usually used in our daily life. The memory device may have many configurations for allocating the memory banks in the memory devices, such as a 16M×4, an 8M×8, a 16M×16, and the other configurations. In the a×4 configuration, four input/output pins are wired to four external electrical leads, wherein a is the capacities of the memory bank. In the a×8 configuration, eight input/output pins are wired to four external electrical leads. The configuration of the memory device can determine the performance, speed, and test time of the memory device.

Compared to the memory device using the a×4 configuration, the memory device using the a×8 configuration has four more input/output pins. Therefore, when the capacities of memory banks of the memory devices using the a×8 and a×4 configurations are the same, the speed of the memory device using the a×8 configuration is faster than that of the memory device using the a×4 configuration, and the test time of the memory device using the a×8 configuration is less than that of the memory device using the a×4 configuration. It is noted that the test time is closely tied to capacities of the memory device, and because the memory devices may have different configurations, it can be difficult to test the memory devices using different configurations efficiently.

Referring to FIG. 1, FIG. 1 is a block diagram showing a conventional memory test system. The conventional memory test system 1 comprises a memory device 10, a probe card 11, and a tester 12. The memory device 10 comprises a memory die 100, N input circuits 101_1 through 101_N, and N output circuits 102_1 through 102_N, wherein N is a number of the memory banks associated with the memory die 100. The memory die 100 has N memory banks, and the N memory banks are respectively electrically connected to N input/output pins IO_1 through IO_N of the N input circuits 101_1 through 101_N. The N output pins of the N input circuits 101_1 through 101_N are respectively electrically connected N input pins of the N output circuits 102_1 through 102_N. The N output pins of the output circuits 102_1 through 102_N are respectively electrically connected to N input pins of the probe card 11, and the N output pins of the probe card 11 are respectively electrically connected to N input pins of the tester 12.

The input circuits 101_1 through 101_N can be the input/output buffers of the memory device 10 for buffering N patches of input/output data, and the output circuits 102_1 through 102_N can be the off-chip drivers (OCD) for adjusting the N output impedances observed from the N output pins of the input circuits 101_1 through 101_N. During a test procedure, N test signals are input to and stored in the memory cells of the N memory banks, and the input circuits 101_1 through 101_N read the N test signals stored in the memory cells of the N memory banks, and outputs the N test signals to the output circuits 102_1 through 102_N. The output circuits 102_1 through 102_N outputs N output signals according to the N test signals respectively, and the N output signals are then received by the probe card 11, and the probe card 11 outputs the N output signals to the tester 12, such that the tester 12 can test whether the N output signals received by the tester 12 are matched to the N test signals originally input to the memory cells of the N memory banks.

A weak OCD is required in the low power consumption memory device 10 (such as dynamic random access memory, DRAM) which can perform less power consumption. However, the tester 12 actually has the heavy load (large impedance) in the wafer level test procedure. To perform chippackage test, too weak OCD is conflicted and not allowed.

For example, the client may merely need the 5 mA signal to drive the components outside the memory device 10, and a 40 mA signal is used to drive the tester 12. If the OCD outputs an output signal of 40 mA, it is obvious that the output current is too high. If the OCD outputs an output signal of 5 mA, it is obvious that the output current cannot drive the tester 12 in the test procedure.

SUMMARY

An exemplary embodiment of the present disclosure provides a memory test system comprising a memory device, a probe card, and a tester. The memory device comprises a memory die with a plurality of memory banks, a plurality of input circuits, and a plurality of output circuits, wherein each of the input circuits has a first input pin and a second pin, the first input pins of the input circuits are used to read a plurality of patches of data stored in memory cells of the memory banks, and the second input pins are used to receive a compressed result. The probe card is electrically connected to the output circuits, and the probe card is electrically connected to the tester. The output circuits receive compressed signals output from the input circuits, and the probe card mixes the compressed output signals output from the output circuits to output a mixed compressed output signal to the tester.

An exemplary embodiment of the present disclosure provides a memory test method, executed in a memory test system comprising a memory device, a probe card, and a tester, wherein memory device has a memory die with a plurality of memory banks, a plurality of input circuits with a first input pins and a second input pins, and a plurality of output circuits electrically connected to the input circuits, and the memory test method comprises steps of: inputting a compressed test signal to memory cells of the memory banks; outputting a compressed result to the input circuits via the second input pins, wherein the compressed result is related to the compressed test signal; outputting compressed signals from the input circuits to the output circuits; outputting compressed output signals from the output circuits to the probe card; mixing the outputting compressed output signals to generate a mixed compressed output signal, at the probe card; outputting the mixed compressed output signal to the tester; and checking the mixed compressed output signal matches to the compressed test signal, at the tester.

To sum up, the memory test system and method provided by exemplary embodiments of the present disclosure can use output circuits with the low power consumption to drive the tester with the heavy load.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
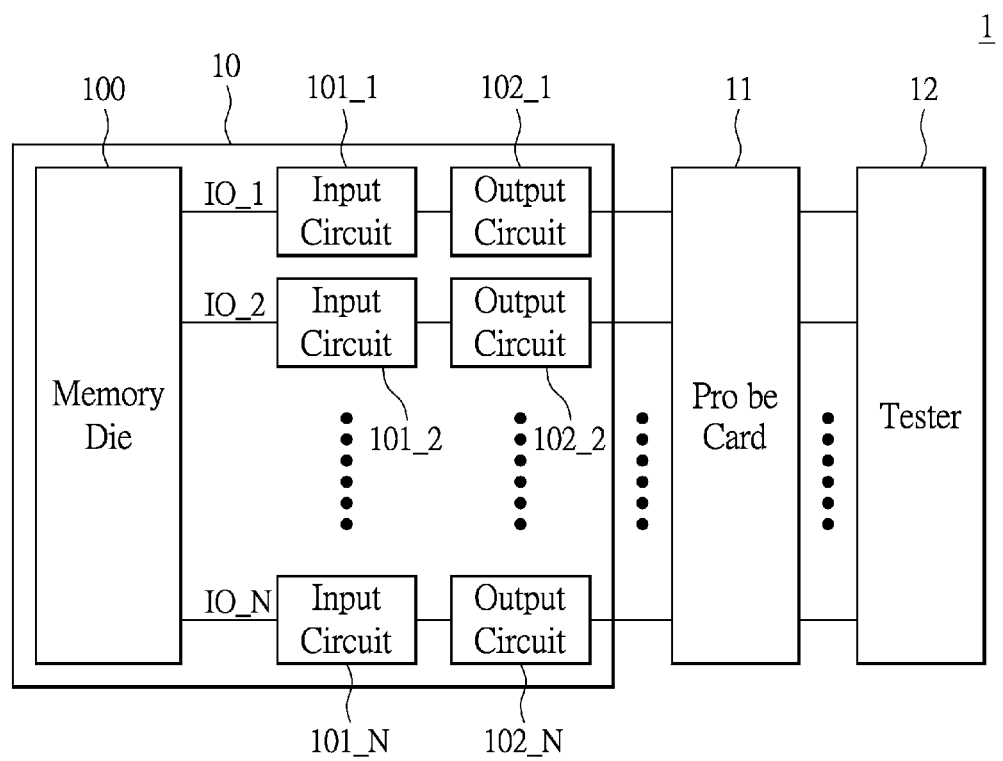
FIG. 1 is a block diagram showing a conventional memory test system.

Reference will now be made in detail to the exemplary embodiments of the present disclosure, examples of which are illustrated in the accompanying drawings. Wherever possible, the same reference numbers are used in the drawings and the description to refer to the same or similar parts.

[Exemplary Embodiment of Memory Test System]

Figure 2:
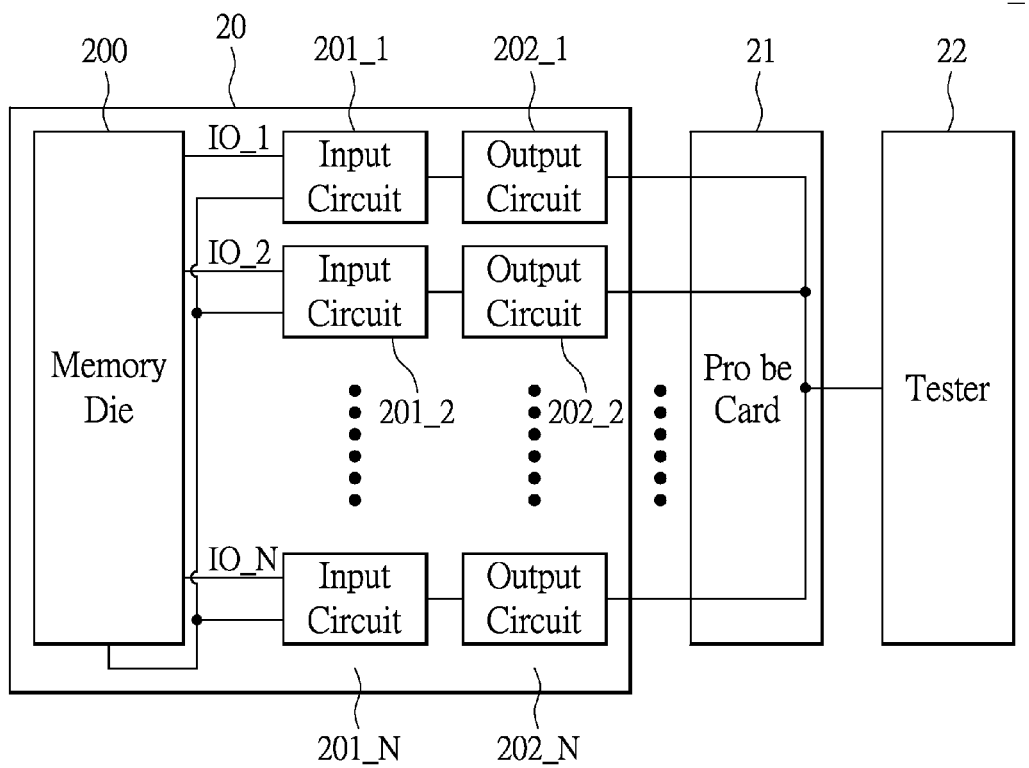
FIG. 2 is a block diagram showing a memory test system according to an exemplary embodiment of the present disclosure.

Referring to FIG. 2, FIG. 2 is a block diagram showing a memory test system according to an exemplary embodiment of the present disclosure. A memory system 2 is used to test the memory device 20 to check whether the memory cells of the memory banks have no defects. The memory test system 2 comprises the memory device 20, a probe card 21, and a tester 22. The memory device 20 is electrically connected to the probe card 21, and the probe card 21 is electrically connected to the tester 22.

The memory device 20 comprises a memory die 200, N input circuits 201_1 through 201_N, and N output circuits 202_1 through 202_N, wherein N is a number of the memory banks associated with memory die 200. The N memory banks of the memory die 200 are respectively electrically connected to N first input pins (such as input/output pins) IO_1 through IO_N of the N input circuits 201_1 through 201_N, such that the N input circuits 201_1 through 201_N read N patches of data stored in the memory cells of the N memory banks. The N memory banks of the memory die 200 are also electrically connected to an output test pin, and the output test pin is connected to a second input pin of the N input circuits 201_1 through 201_N, such that the N input circuits 201_1 through 201_N receives a compressed result.

Furthermore, N output pins of the N input circuits 201_1 through 201_N are respectively electrically connected to N input pins of the output circuits 202_1 through 202_N, and N output pins of the output circuits 202_1 through 202_N are respectively electrically connected to N input pins of the probe card 21. The N input pins are wired to one internal end of the probe card 21 (i.e. the probe card 21 mixes the signals on the N input pins of the probe card 21, or the probe card 21 shorts the N input pins of the probe card 21). An output pin of the probe card 21 is electrically connected to an input pin of the tester 22, such that the tester 22 receives a signal on the output pin of the probe card 21.

The N input circuits 201_1 through 201_N can be N input/output buffers of the memory device 10 for buffering the N patches of input/output data or the compressed result, but the present disclosure is not limited thereto. For example, each of the N input circuits 201_1 through 201_N may comprise a buffer, an amplifier, and a filter. The N output circuits 202_1 through 202_N can be N OCDs for adjusting N output impedances observed from the N output pins of the input circuits 201_1 through 201_N, but the present disclosure is not limited thereto. For example, each of the N output circuits 202_1 through 202_N may comprise an OCD, an amplifier, and a filter.

During a test procedure, a compressed test signal is input to and stored in the memory cells of the N memory banks of the memory die 200. Then, via the N second input pins of the N input circuits 201_1 through 201_N, the N input circuits 201_1 through 201_N receive the compressed result which related to the compressed test signal stored in the memory cells of the N memory banks.

Next, the N input circuits 201_1 through 201_N outputs N compressed signals according to the compressed result. The N output circuits 202_1 through 202_N receive the N compressed signals, and output N compressed output signals according to the N compressed signals. The probing card 21 receives the N compressed output signals, and mixing the N compressed output signals to output a mixed compressed output signal to the tester 22. Then, the tester 22 checks whether the mixed compressed output signal matches to the compressed test signal. If the mixed compressed output signal matches to the compressed test signal, the tester 22 outputs the information showing the memory cells of the memory banks have no defects.

For example, the number of the memory banks is 8, the client may merely need the 5 mA signal to drive the components outside the memory device 20, and a 40 mA signal is used to drive the tester 12. If the OCD outputs an output signal of 5 mA, it is obvious that the output current (8×5 mA=40 mA) of the mixed compressed output signal from the probe card 21 is sufficient to drive the tester 22, and the OCD can be weak OCD in the low power consumption memory device 20 (such as dynamic random access memory, DRAM) which can perform less power consumption.

[Exemplary Embodiment of Memory Test Method]

Figure 3:
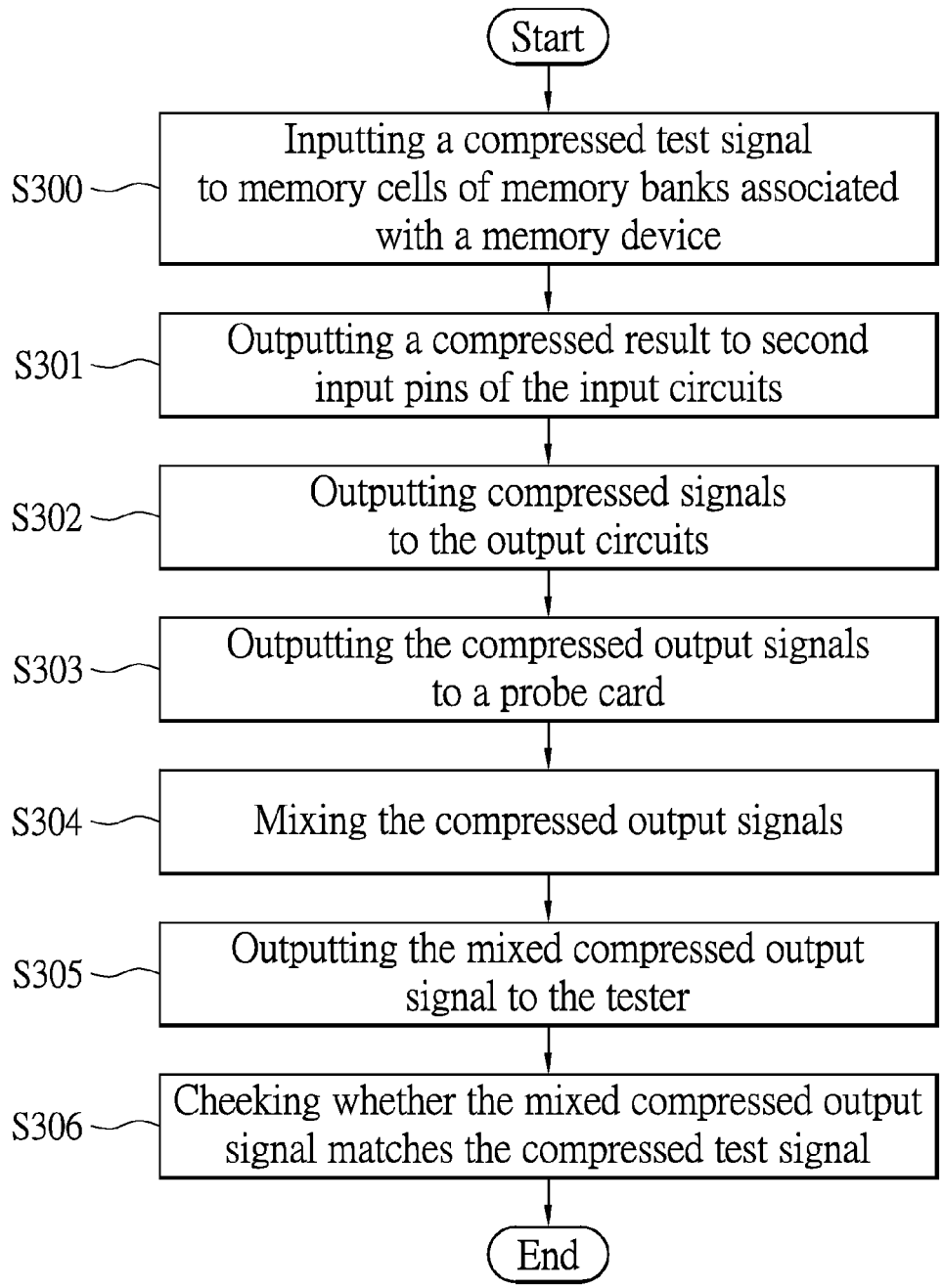
FIG. 3 is a flow chart showing a memory test method according to an exemplary embodiment of the present disclosure.

Referring to FIG. 3, FIG. 3 is a flow chart showing a memory test method according to an exemplary embodiment of the present disclosure. The test method herein is executed in a memory test system for testing the memory device to check whether the memory cells of the memory banks have no defects. At step S300, a compressed test signal is input to the memory cells of memory banks associated with a memory device. Then, at step S301, a compressed result related to the compressed test signal is output to the second input pins of the input circuits of the memory device, and that is the input circuits of the memory device receive the compressed result via their second input pins. By the way, the first input pins of the input circuits are used to read patches of the data stored in the memory cells of the memory banks.

Next, at step S302, the input circuits output compressed signals to the output circuits, wherein the compressed signals are related to the compressed result. Then, at step S303, the output circuits output the compressed output signals to a probe card, wherein the compressed output signals are related to the compressed signals. At step S304, the probe card mixes the compressed output signals to generate a mixed compressed output signal. At step S305, the probe card outputs the mixed compressed output signal to the tester. Next, at step S306, the tester checks whether the mixed compressed output signal matches to the compressed test signal.

[Possible Result of Exemplary Embodiment]

To sum up, the input circuits of the memory device in the above exemplary embodiment use another input pins to receive a compressed result, and the probe card mixes the compressed output signals. Accordingly, the memory test system and method provided by exemplary embodiments of the present disclosure can use output circuits with the low power consumption to drive the tester with the heavy load.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A memory test system, comprising:
a memory device, comprising a memory die with a plurality of memory banks, a plurality of input circuits, and a plurality of output circuits, wherein each of the input circuits has a first input pin and a second pin, the first input pins of the input circuits are used to read a plurality of patches of data stored in memory cells of the memory banks, and the second input pins are used to receive a compressed result;
a probe card, electrically connected to the output circuits; and
a tester, electrically connected to the probe card;
wherein the output circuits receive compressed signals output from the input circuits, and the probe card mixes compressed output signals output from the output circuits to output a mixed compressed output signal to the tester.

2. The memory test system according to claim 1, wherein the input circuits are buffers.

3. The memory test system according to claim 1, wherein the first input pins are input/output pins.

4. The memory test system according to claim 1, wherein the output circuits are off-chip drivers.

5. The memory test system according to claim 1, wherein the memory device is a dynamic random access memory.

* * * * *